(12) United States Patent
Park et al.

(10) Patent No.: US 7,098,520 B2
(45) Date of Patent: Aug. 29, 2006

(54) SEMICONDUCTOR MEMORY DEVICE HAVING PICK-UP STRUCTURE

(75) Inventors: Byung-Kwon Park, Ichon-shi (KR); Kyung-Wook Park, Ichon-shi (KR)

(73) Assignee: Hynix Semiconductor, Inc., (KR)

( * ) Notice: Subject to any disclaimer, the term of this patent is extended or adjusted under 35 U.S.C. 154(b) by 222 days.

(21) Appl. No.: 10/875,748

(22) Filed: Jun. 23, 2004

(65) Prior Publication Data
US 2004/0262706 A1 Dec. 30, 2004

(30) Foreign Application Priority Data
Jun. 24, 2003 (KR) ............... 10-2003-0040992
Oct. 31, 2003 (KR) ............... 10-2003-0076992

(51) Int. Cl.
*H01L 21/8249* (2006.01)
(52) U.S. Cl. ............... 257/452; 257/448; 257/297
(58) Field of Classification Search ............... 257/452, 257/448, 297
See application file for complete search history.

(56) References Cited

U.S. PATENT DOCUMENTS 4,597,805 A * 7/1986 Mohan Rao ............ 438/241
4,634,901 A 1/1987 McElroy
4,825,417 A 4/1989 Seo
5,552,728 A 9/1996 Lin
5,907,170 A 5/1999 Forbes et al.
6,072,209 A 6/2000 Noble et al.
6,537,871 B1 3/2003 Forbes et al.
6,538,330 B1 3/2003 Forbes

FOREIGN PATENT DOCUMENTS

JP 2002-141415 5/2002

* cited by examiner

*Primary Examiner*—David Nelms
*Assistant Examiner*—Thinh T Nguyen
(74) *Attorney, Agent, or Firm*—Blakely Sokoloff Taylor & Zafman

(57) ABSTRACT

A semiconductor memory device includes a first transistor area doped by a first-type dopant for having a plurality of second-type transistors; a second transistor area doped by a second-type dopant for having a plurality of first-type transistors; a first guardring area doped by the first-type dopant between the first and second transistor areas; and a second guardring area doped by the second-type dopant between the first and second transistor areas, wherein the second guardring area runs parallel with the first guardring area in the direction from the first transistor area to the second transistor area.

10 Claims, 5 Drawing Sheets

SEMICONDUCTOR MEMORY DEVICE HAVING PICK-UP STRUCTURE

FIELD OF INVENTION

The present invention relates to a semiconductor memory device; and, more particularly, to how to design a guardring area, which is included in the semiconductor memory device, for effectively reducing a total area of the semiconductor memory device.

DESCRIPTION OF PRIOR ART

Typically, a semiconductor memory device has a plurality of N-channel metal oxide semiconductor (NMOS) transistors and P-channel metal oxide semiconductor (PMOS) transistors. Each metal oxide semiconductor (MOS) transistor has four terminals, i.e., a source, a drain, a gate and a substrate. Herein, the substrate is usually formed as a well region. A dopant density of the well region is lower about $1/10000$ or $1/1000000$ times than that of the source or drain.

Generally, the PMOS transistor is formed in an N-well region and the NMOS transistor is formed in a P-well region. For preventing an operation error of the MOS transistor, the N-well and P-well regions are individually supplied with a proper bias voltage (typically, the proper bias voltage is called a bulk bias). Usually, the N-well region is supplied with one of a ground VSS and a back bias voltage VBB. Also, the P-well region is supplied with a high level supply voltage VPP. Herein, the high level supply voltage VPP has higher voltage level than a supply voltage VDD does.

Meanwhile, for supplying the bulk bias to one of the N-well region and the P-well region, the N-well region or the P-well region should be connected to a conductor. However, if a conductor, e.g., a metal, having a great conductivity is connected to one of the N-well region and the P-well region, a contact resistance is very large. As a result, the MOS transistor can be abnormally operated because of the large contact resistance.

Thus, one side of the well region (P-well region or N-well region), i.e., an opposite side of where the source or the drain is formed, is also doped by the same dopant that already doped in the same well region. After that, a relatively high doped area, e.g., a guardring area, is generated in the well region. For example, the density of the relatively high doped area in the well region is about $1E20/cm^3$. Then, the bulk bias is supplied with the well region through the relatively high doped area in order to prevent a latch up phenomenon between the PMOS transistor and the NMOS transistor. Herein, the relatively high doped area is called a guardring area or a pick-up area.

In a dynamic random access memory (DRAM), each size of cell matrix peripheral areas occupied by peripheral circuits, i.e., a sense amplifer, sub-wordline driver, a row decoder, a column decoder and like this, included in a core area of the semiconductor memory device is important factor to reduce a chip size of the semiconductor memory device. It is because the peripheral circuits are repeatedly located in every cell matrix (cell array) or every bank. Herein, the cell matrix peripheral area should include the guardring area in order to supply the bulk bias to the well region and prevent the latch up phenomenon.

The guardring area can be simultaneously formed at the timing when source and drain areas of the MOS transistor are formed. Thus, there is no additional manufacturing step, but the substrate has an enough area for forming the guardring area. However, for forming the guardring area in the above described process, there are some limitations, e.g., a shortest distance between an active region of the PMOS transistor and an active region of the NMOS transistor, a minimum width of the active region of the NMOS transistor, a shortest distance between the active region of the NMOS transistor and the N-well region and like this. That is, it is inevitable to increase the chip size of the semiconductor memory device because the above described limitations are kept for guaranteeing a stable operation of the semiconductor memory device.

FIG. 1 is a block diagram showing a bulk bias layout of a semiconductor memory device in accordance with the prior art.

As shown, in the semiconductor memory device, there are a PMOS transistor area 10, a NMOS transistor area 12, a N-well guardring area 14 and a P-well guardring area 16. The PMOS transistor area 10 includes a plurality of PMOS transistors and the NMOS transistor 12 includes a plurality of NMOS transistors. Herein, according to a voltage level, i.e., a level of a bulk bias voltage, which is supplied to each area, the N-well guardring area 14 and the P-well guardring area 16 can be divided. Namely, the bulk bias voltage of the P-well guardring area 16 is one of VBB and ground, but the bulk bias voltage of the N-well guardring area 14 is VPP. As a result, the latch up phenomenon between the P-well region and the N-well region is prevented.

Referring to FIG. 1, the N-well guardring area 14 runs parallel with the P-well guardring area 16 in a y-axis direction. However, because each of the N-well guardring area 14 and the P-well guardring area 16 is supplied with each of VPP and ground, the minimum distance detached between the N-well guardring area 14 and the P-well guardring area 16 is guaranteed for a stable operation of the semiconductor memory device. As a result, a size of the guardring area is increased and a chip size of the semiconductor memory device is also increased.

For reducing the chip size of the semiconductor memory device, it is suggested and considered that the guardring area has only one area of the N-well guardring area and the P-well guardring area. However, in this case, the MOS transistors are deteriorated by a heat which caused by the latch up phenomenon and an operation of the semiconductor memory device is not stabled.

FIG. 2 is a block diagram showing a guardring area layout included in a core area of the semiconductor memory device in accordance with the prior art.

As shown, the core area includes a plurality of cell matrix regions MATs, a plurality of sense amplifier regions SAs, a plurality of sub-word line regions SWDs and a cross region CA. The cell matrix region MAT has a plurality of unit cells. The sense amplifier region SA having a plurality of sense amplifiers is allocated in an x-axis direction between the cell matrix region MATs. Also, the sub-word line region SWD is allocated in a y-axis direction between the cell matrix regions MATS. The cross region CA is a region in which the sense amplifier region SA is crossly connected to the sub-word line region SWD.

Typically, if not shown, a power mesh line is allocated upper the plurality of cell matrix regions MATs; and, upper the cross region CA, a lot of sense amplifier drivers and input-output switches are allocated.

On the other hands, as shown in FIG. 2, the sense amplifier region SA and the sub-word line region SWD includes only N-well guardring area supplied with the VPP, i.e., a higher voltage than a supply voltage VDD. Also, the cross region CA has only P-well guardring area supplied with the VBB, i.e., a back bias voltage. Herein, a P-well guardring area of the cross region CA is coupled to a P-well region; and, thus, the VBB is supplied to the P-well region of the sub-word line area SWD. Thus, it is possible to arrange only one type well region, e.g., the P-well or N-well guardring area, in each of the sense amplifier area SAs, the sub-word line area SWDs and the cross region CA.

However, in this case, the cross region CA can not be effectively used because the cross region CA includes the P-well guardring area supplied with the VBB.

FIG. 3 is a top view showing a layout of a sense amplifier area included in the semiconductor memory device in accordance with the prior art.

As shown, a N-well region includes a PMOS transistor area and a N-well guardring area. The PMOS transistor area has a plurality of PMOS transistors which are drivers, each for activating or inactivating a RTO line which is a kind of control signals used in each sense amplifier. Also, a P-well region includes a NMOS transistor area and a P-well guardring area. The NMOS transistor area has a plurality of NMOS transistors which are drivers, each for activating or inactivating a SB line which is a kind of control signals used in each sense amplifier. Herein, the N-well guardring area runs parallel with the P-well guardring area between the NMOS transistor area and the PMOS transistor area in a direction perpendicularly crossing each second metal wire M2.

In addition, there are two metal wires M1s, each overlapping each of the N-well guardring area and the P-well guardring area. As the two first metal wires M1s adjacently runs parallel with each other, a cross talk phenomenon is occurred and capacitances of the two first metal wires M1s can be increased.

SUMMARY OF INVENTION

It is, therefore, an object of the present invention to provide a semiconductor memory device for minimizing an increase of chip size because of P-well and N-well guardring areas.

Also, it is another object of the present invention to provide a semiconductor memory device for effectively using a cross area, i.e., a region in which a sense amplifier area SA is crossly connected to a sub-word line area SWD, included in a core area of the semiconductor memory device.

In accordance with an aspect of the present invention, there is provided a semiconductor memory device including a first transistor area doped by a first-type dopant for having a plurality of second-type transistors; a second transistor area doped by a second-type dopant for having a plurality of first-type transistors; a first guardring area doped by the first-type dopant between the first and second transistor areas; and a second guardring area doped by the second-type dopant between the first and second transistor areas, wherein the second guardring area runs parallel with the first guardring area in the direction from the first transistor area to the second transistor area.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device having a P-well or N-well guardring area according to the present invention will be described in detail referring to the accompanying drawings.

Figure 4:
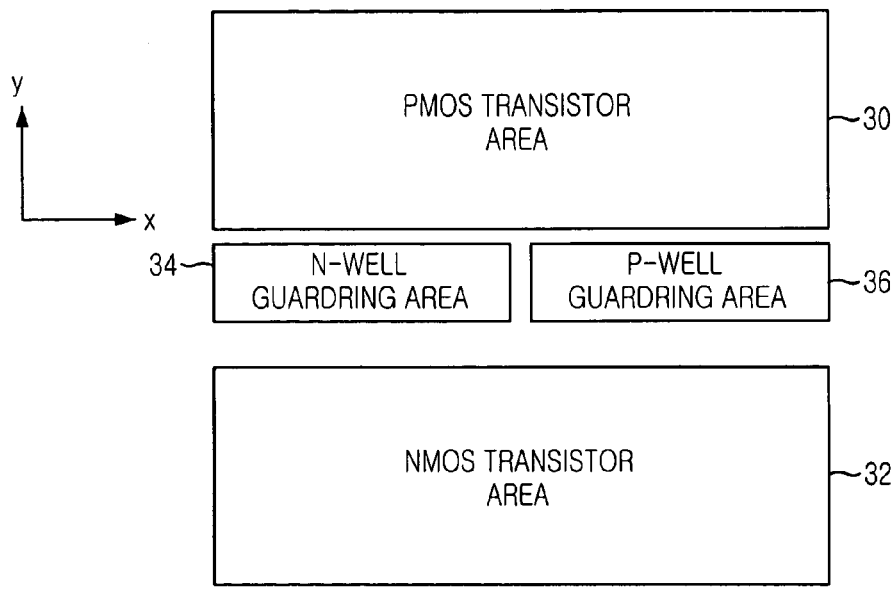
FIG. 4 is a block diagram showing a bulk bias layout of a semiconductor memory device in accordance with a first embodiment of the present invention.

FIG. 4 is a block diagram showing a bulk bias layout of a semiconductor memory device in accordance with a first embodiment of the present invention.

As shown, the semiconductor memory device includes a PMOS transistor area 30, a NMOS transistor area 32, a N-well guardring area 34 and a P-well guardring area 36. Herein, the PMOS transistor area 30 containing a plurality of PMOS transistors and the N-well guardring area 34 allocated between the PMOS transistor area 30 and the NMOS transistor area 32 are included in a N-well region. Also, the NMOS transistor area 32 containing a plurality of NMOS transistors and the P-well guardring area 36 allocated between the PMOS transistor area 30 and the NMOS transistor area 32 are included in a P-well region. The N-well guardring area 34 and the P-well guardring area 36 are allocated on the same x-axis.

Figure 1:
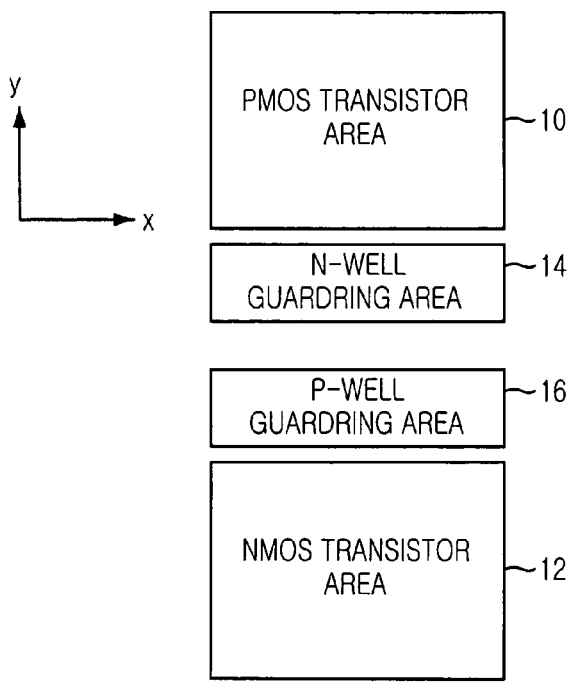
FIG. 1 is a block diagram showing a bulk bias layout of a semiconductor memory device in accordance with the prior art.

As a result, as compared with the prior art shown in FIG. 1, total guardring area of the semiconductor memory device can be reduced when the N-well and P-well guardring areas 34 and 36 are allocated in a direction of the x-axis.

Figure 5:
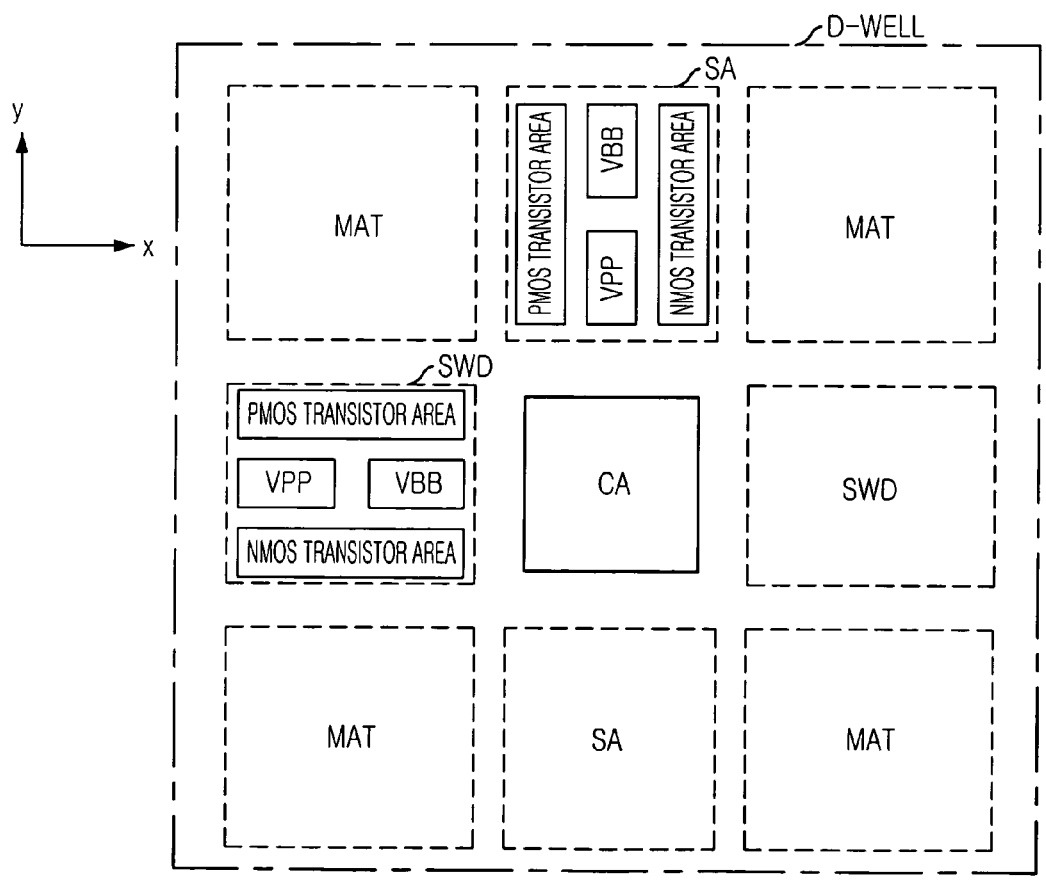
FIG. 5 is a block diagram showing a guardring area layout included in a core area of the semiconductor memory device in accordance with the first embodiment of the present invention.

FIG. 5 is a block diagram showing a guardring area layout included in a core area of the semiconductor memory device in accordance with the first embodiment of the present invention.

As shown, the core area includes a plurality of cell matrix regions MATs, a plurality of sense amplifier regions SAs, a plurality of sub-word line regions SWDs and a cross region CA. The cell matrix region MAT has a plurality of unit cells. The sense amplifier region SA having a plurality of sense amplifiers is allocated in an x-axis direction between the cell matrix regions MATs. Also, the sub-word line region SWD is allocated in a y-axis direction between the cell matrix regions MATs. The cross region CA is a region in which the sense amplifier region SA is crossly connected to the sub-word line region SWD.

Figure 3:
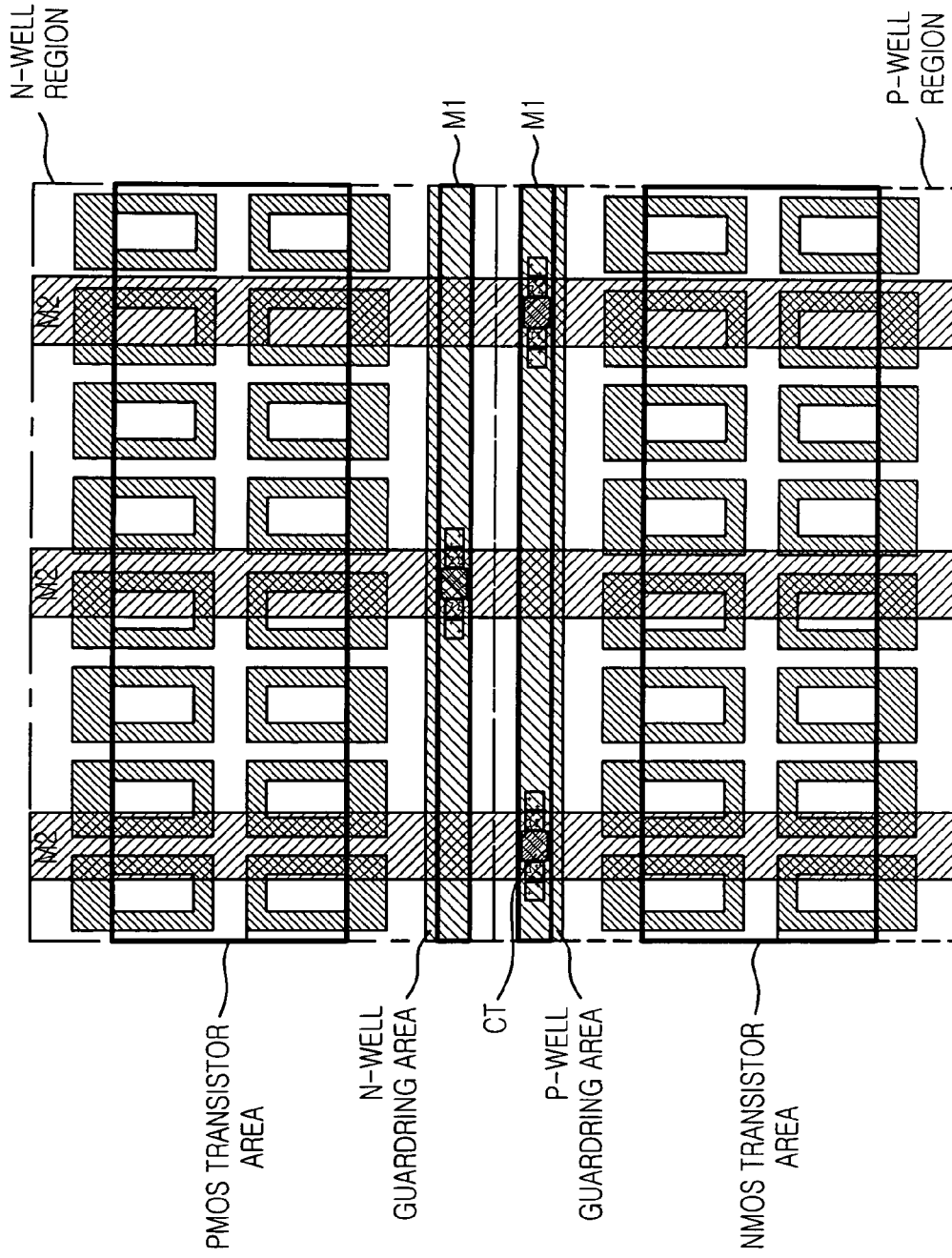
FIG. 3 is a top view showing a layout of a sense amplifier area included in the semiconductor memory device in accordance with the prior art.

That is, a formation of the core area in accordance with the present invention is the same to that in accordance with the prior art. However, in the present invention, a P-well region and a N-well region included in each of the sense amplifier regions SAs and the sub-word line regions SWDs are the same to those shown in FIG. 3.

Figure 2:
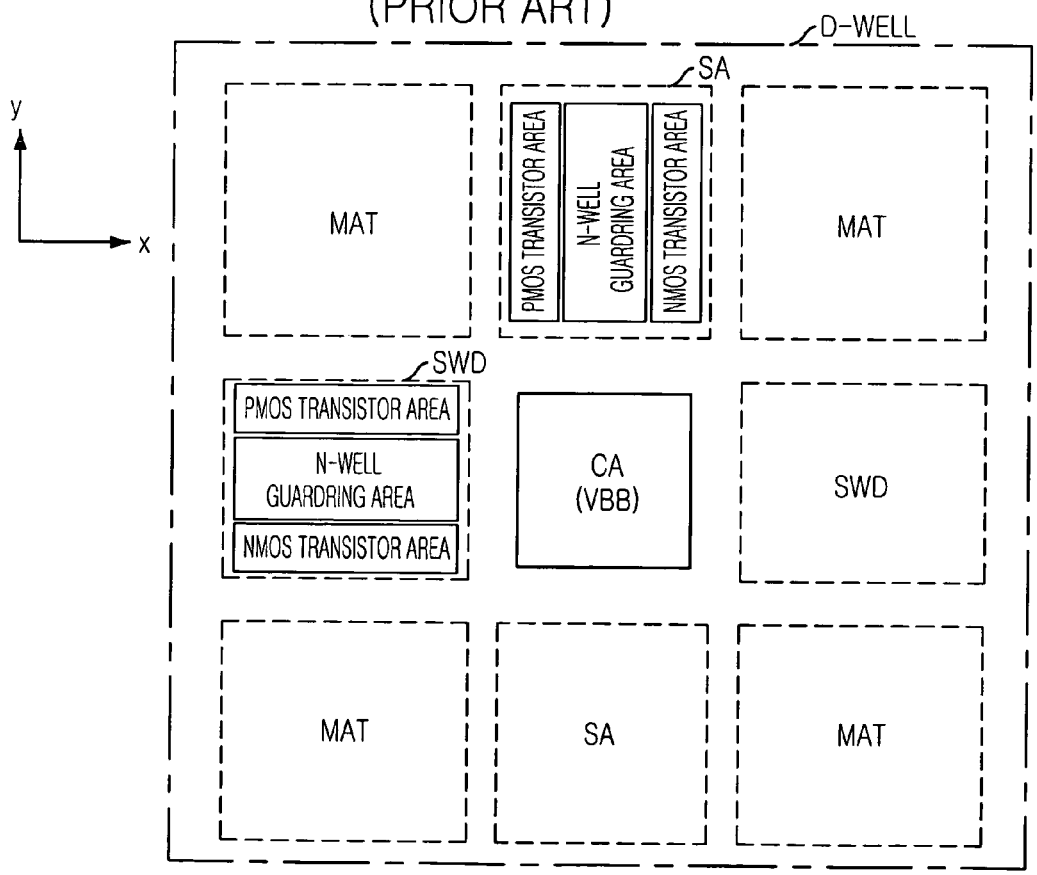
FIG. 2 is a block diagram showing a guardring area layout included in a core area of the semiconductor memory device in accordance with the prior art.

Thus, as compared with a guardring area layout included in a core area shown in FIG. 2, both of the N-well guardring area and the P-well guardring area can be included in each of the sense amplifier areas SAs and the sub-word line areas SWDs without increasing a size of the core area.

Figure 6:
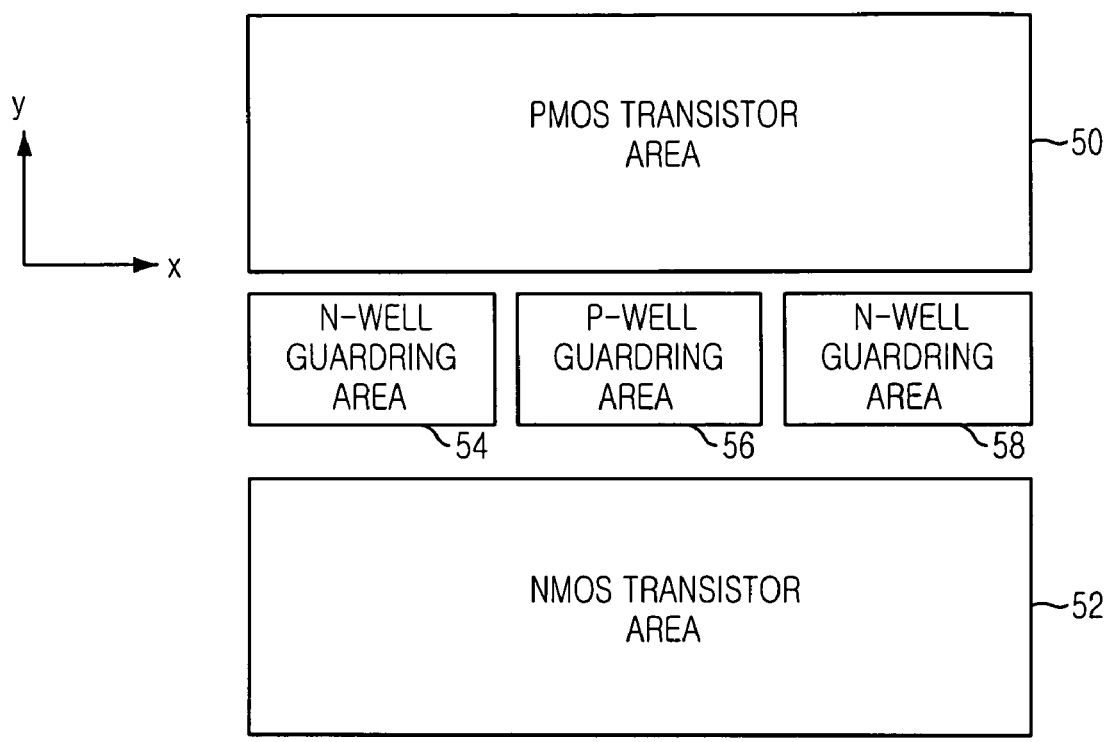
FIG. 6 is a block diagram showing a bulk bias layout of the semiconductor memory device in accordance with a second embodiment of the present invention.

FIG. 6 is a block diagram showing a bulk bias layout of the semiconductor memory device in accordance with a second embodiment of the present invention.

As shown, the semiconductor memory device includes a PMOS transistor area 50, a NMOS transistor area 52, a first N-well guardring area 54, a second N-well guardring area 58 and a P-well guardring area 56. Herein, the PMOS transistor area 50 containing a plurality of PMOS transistors and the first and second N-well guardring areas 54 and 58 allocated between the PMOS transistor area 50 and the NMOS transistor area 52 are included in a N-well region. Also, the NMOS transistor area 52 containing a plurality of NMOS transistors and the P-well guardring area 56 allocated between the PMOS transistor area 50 and the NMOS transistor area 52 are included in a P-well region. The P-well guardring area 56, the first N-well guardring area 54 and the second N-well guardring area 58 are allocated on the same x-axis.

Meanwhile, on one x-axis, it is possible to arrange two P-well guardring areas and one N-well guardring area. Also, it is possible to arrange a plurality of P-well guardring areas and a plurality of N-well guardring areas in shifts.

Figure 7:
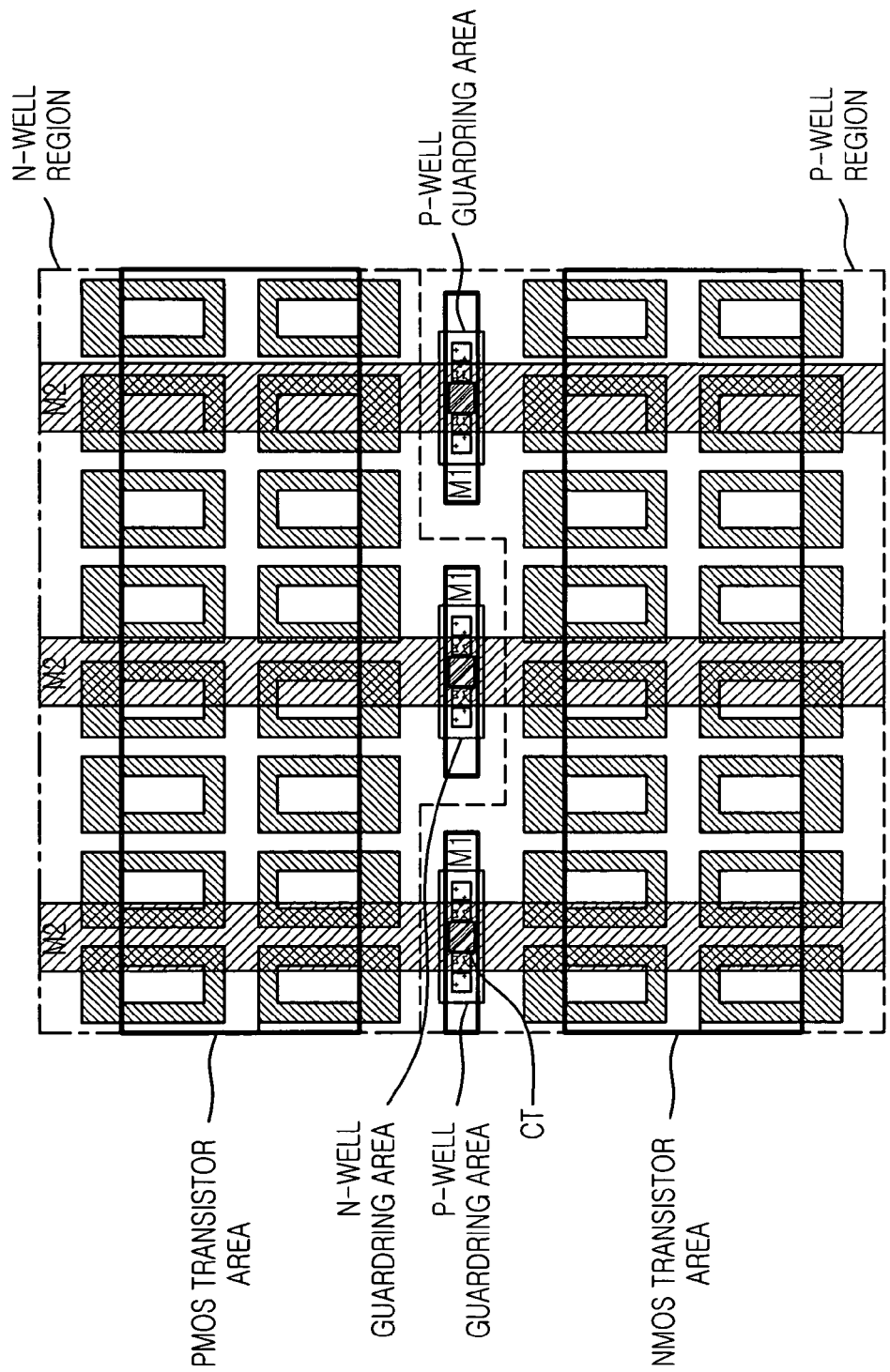
FIG. 7 is a top view showing a layout of a sense amplifier area included in the semiconductor memory device in accordance with the prior art.

FIG. 7 is a top view showing a layout of a sense amplifier area included in the semiconductor memory device in accordance with the prior art.

As shown, a N-well region includes a PMOS transistor area and a N-well guardring area. The PMOS transistor area has a plurality of PMOS transistors which are drivers, each for activating or inactivating a RTO line which is a kind of control signals used in each sense amplifier. Also, a P-well region includes a NMOS transistor area, a first P-well guardring area and a second P-well guardring area. The NMOS transistor area has a plurality of NMOS transistors which are drivers, each for activating or inactivating a SB line which is a kind of control signals used in each sense amplifier. Herein, the N-well guardring area, the first P-well guardring area and second P-well guardring area are allocated in shifts on the same axis between the NMOS transistor area and the PMOS transistor area, i.e., the axis perpendicularly crossing each second metal wire M2.

Thus, a boundary between the N-well region and the P-well region is curved in a shape of a clock signal. Also, first metal wires M1s in the P-well and N-well guardring area are allocated on the same axis perpendicularly crossing each second metal wire M2; and, then, the semiconductor memory device in accordance with the present invention can prevent a cross talk phenomenon and capacitance generated between the two first metal wires M1s.

Meanwhile, a bulk bias voltage is transmitted to the P-well or N-well guardring area through the first and second metal wires M1 and M2. Herein, the first and second metal wires M1 and M2 are coupled to each other through a contact point CT.

As above described, though the present invention can be applied to a layout of peripheral circuit area in the semiconductor memory device, it is more effective to apply the present invention to a layout of core circuit area in the semiconductor memory device.

Furthermore, in the first and second embodiment of the present invention, the P-well guardring area can be supplied with not only the VDD, i.e., a back bias voltage, but also a ground VSS. In addition, the N-well guardring area can be supplied with not only the VPP, i.e., a higher voltage than a supply voltage VDD, but also the supply voltage VDD.

The present application contains subject matter related to Korean patent application Nos. 2003-40992 and 2003-76992, filed in the Korean Patent Office on Jun. 24, 2003 and Oct. 31, 2003, respectively the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device, comprising:
    a first transistor area doped by a first-type dopant for including a plurality of second-type transistors;
    a second transistor area doped by a second-type dopant for including a plurality of first-type transistors;
    a first guardring area doped by the first-type dopant between the first and second transistor areas; and
    a second guardring area doped by the second-type dopant between the first and second transistor areas,
    wherein the second guardring area runs parallel with the first guardring area in the direction from the first transistor area to the second transistor area.

2. The semiconductor memory device as recited in claim 1, further comprising a third guardring area, which is doped by the first-type dopant between the first and second transistor areas, runs parallel with the second guardring area in the direction from the first transistor area to the second transistor area.

3. The semiconductor memory device as recited in claim 2, wherein the first-type dopant is N-type and the second-type dopant is P-type.

4. The semiconductor memory device as recited in claim 3, wherein the first guardring area is supplied with one of a core voltage and a high level supply voltage.

5. The semiconductor memory device as recited in claim 4, wherein the second guardring area is supplied with one of a back bias voltage and a ground.

6. The semiconductor memory device as recited in claim 2, wherein the first-type dopant is P-type and the second-type dopant is N-type.

7. The semiconductor memory device as recited in claim 6, wherein the first guardring area is supplied with one of a core voltage and a high level supply voltage.

8. The semiconductor memory device as recited in claim 7, wherein the second guardring area is supplied with one of a back bias voltage and a ground.

9. The semiconductor memory device as recited in claim 1, further comprising a metal wire formed as an independent pattern for overlapping the first and second guardring areas.

10. The semiconductor memory device as recited in claim 1, wherein a boundary line between the first and second guardring areas is curved in a shape of a clock signal.

* * * * *